US012613474B2

(12) United States Patent
Angelakos et al.

(10) Patent No.: US 12,613,474 B2
(45) Date of Patent: *Apr. 28, 2026

(54) PHOTOEXCITATION METHOD

(71) Applicant: Nanotronix Inc., Wilmington, DE (US)

(72) Inventors: Evangelos Angelakos, Wilmington, DE (US); Theodoros Manouras, Wilmington, DE (US)

( * ) Notice: Subject to any disclaimer, the term of this patent is extended or adjusted under 35 U.S.C. 154(b) by 662 days.

This patent is subject to a terminal disclaimer.

(21) Appl. No.: 17/694,039

(22) Filed: Mar. 14, 2022

(65) Prior Publication Data

US 2022/0244650 A1 Aug. 4, 2022

Related U.S. Application Data

(63) Continuation-in-part of application No. 16/081,777, filed as application No. PCT/GB2016/050575 on Mar. 4, 2016, now Pat. No. 11,275,308.

(30) Foreign Application Priority Data

Mar. 4, 2016 (WO) ............... PCT/GB2016/050575

(51) Int. Cl.
G03F 7/028 (2006.01)
G03F 7/00 (2006.01)
G03F 7/20 (2006.01)

(52) U.S. Cl.
CPC .......... *G03F 7/70641* (2013.01); *G03F 7/028* (2013.01); *G03F 7/2053* (2013.01)

(58) Field of Classification Search
None
See application file for complete search history.

(56) References Cited

U.S. PATENT DOCUMENTS

| | | | | |
|---|---|---|---|---|
| 5,639,413 A * | 6/1997 | Crivello | ............... | G03F 7/0757 |
| | | | | 264/401 |
| 11,275,308 B2 * | 3/2022 | Angelakos | .......... | G03F 7/70383 |
| 2003/0139484 A1 * | 7/2003 | Bentsen | ............... | G03F 7/0037 |
| | | | | 522/2 |
| 2004/0042937 A1 * | 3/2004 | Bentsen | ............... | G03F 7/2053 |
| | | | | 264/494 |

FOREIGN PATENT DOCUMENTS

WO 2015/092570 A1 6/2015

OTHER PUBLICATIONS

Yongyuan et al., "Two-photon Microstructure-polymerization Initiated by a Coumarin Derivative, Titanocene and N-phenylglycine System", J. photopolymer. Sci. Technol., vol. 15(1) pp. 83-99 (2002).*

Li et al., "Two- photon microstructure-polymerization initiated by a coumarin derivative/iodonium salt system"., Chem. Phys. Lett., vol. 340 pp. 444-448 (2001).*

(Continued)

*Primary Examiner* — Martin J Angebranndt

(74) *Attorney, Agent, or Firm* — Patshegen IP; Moshe Pinchas

(57) ABSTRACT

A method and composition for enabling indirect photoexcitation whereby a large energy gap between energy levels in a second material is circumvented by a series of lower energy photoexcitations in a first material.

5 Claims, 15 Drawing Sheets

S2100 — Provide composite photoresist over a substrate

S2200 — Expose target areas of photoresist to low energy photons using a laser

S2300 — Resulting degradation of the second material (e.g. monomers) at first material (e.g. coumarine 307) sites, within the target area, leads to the de-polymerization or the polymerization/crosslinking of the second material (e.g. monomers) depending on the desired application (positive or negative photoresist)

S2400 — Depending on the desired application, the de-polymerized or polymerized/crosslinked areas are then developed (washed away) by the use of appropriate solvent (e.g. isopropanol).

(56)         References Cited

OTHER PUBLICATIONS

Li et al. "A straightforward stynthesis and structure-activity relationship of highly efficient initiators for two-photopolymerization", Macromol. vol. 46, pp. 352-361 (Jan. 2013).*

Mendonca et al., "A novel photoinitiator for microfabrication via two-photo polymerization", in Conference on Lasers and Electro-Optics/Quantum Electronics and Laser Science Conference and Photonic Applications Systems Technologies, Technical Digest (CD) (Optica Publishing Group, 2006), paper CThQ5 (2006).*

Ferreras Paz et al., "Development of functional sub-100 nm structures with 3D two-photon polymerization technique and optical methods for characterization", J. Laser Appl. vol. 24 Article 042004, 4 pages (2012).*

Haske et al., "65 nm features sizes using visible wavelength 3D multiphotolithography", Opt. Express., vol. 15(8) pp. 3426-3436 (Mar. 2007).*

Lippert et al. "Laser ablation of doped polymer systems", Adv. Mater., vol. 9(2) pp. 105-119 (1997).*

Acikgoz et al.. "Investigation of spontaneous emission rate of perylene dye molecules encapsulated into three-dimensional nanofibers via FLIM method" Appl. Phys. A., vol. 116, pp. 1867-1875 (Mar. 2014).*

PicoQuant website for LDH series lasers (no date).*

Melnikov et al. "Two photon absorption crops section for coumarins 102, 153 and 307", J. Phys.: Conf. Ser. vol. 917, article 062029, 7 pages (2017).*

Mueller et al. "3D direct laser writing using a 405 nm diode laser", Opt. lett. vol. 39(24) 6847-6850 (Dec. 2014).*

Thiel et al. "Direct laser writing of three-dimensional submicron structures using a continuous-wave laser at 532 nm", Appl. Phys. Lett., 97 article 221102 (3 pages) (Nov. 2010).*

Dey et al. "Fabrication of ridge polymer waveguide by direct laser writing as 375 nm wavelength", Opt. Photon., Photonics 2014 paper M2B.6, 3 pages, (2014).*

Dartnell et al., "Experimental determination of photostability and fluorescence-based detection of PAHs on the Martian surface", Meteorics & Planetary Sci. vol. 47(5) pp. 806-819 (2012) (Year: 2012).*

Crivello et al., "Anthracene electron-transfer photosensitizers for onium salt induced cationic photopolymerizations", J. Photochem Photobiol. A:Chem. vol. 159 pp. 173-188 (2003) (Year: 2003).*

Mendez-Ramos et al. "Infrared-light induced curing of photosensitive resins through up-conversion for novel cost-effective luminescent 3D-printing technology", J. Mater. Chem. C vol. 2016(4) pp. 801-806 (2016) (Year: 2016).*

Encinas et al., "methyl methacrylate polymerization photoinitiated by pyrene in the presence of triethylamine", Macromol. vol. 22(2) 563-566 (1989) (Year: 1989).*

Mannekutla et al., "Solvent effect on absorption and fluorescence spectra of coumarin laser dyes: Evaluation of ground and excited state dipole moments", Spectrochimica Acta part A, vol. 69, pp. 419-420 (2008).*

ISR; European Patent Office; NL; Aug. 12, 2016.

www.spie.org; "Advanced Lithography"; Feb. 25, 2016.

Manouras Theodoros et al: "Exploring the Potential of Multiphoton Laser Ablation Lithography (MP-LAL) as a Reliable Technique for Sub-50NM Patterning," Mar. 22, 2016.

* cited by examiner

S1100 — Provide composite photoresist over a substrate

S1200 — Expose target areas of photoresist to low energy photons using a laser

S1300 — Resulting degradation of the second material (e.g. polymer) at first material (e.g. perylene) sites, within the target area, leads to ablation of the photoresist and exposure of the underlying substrate

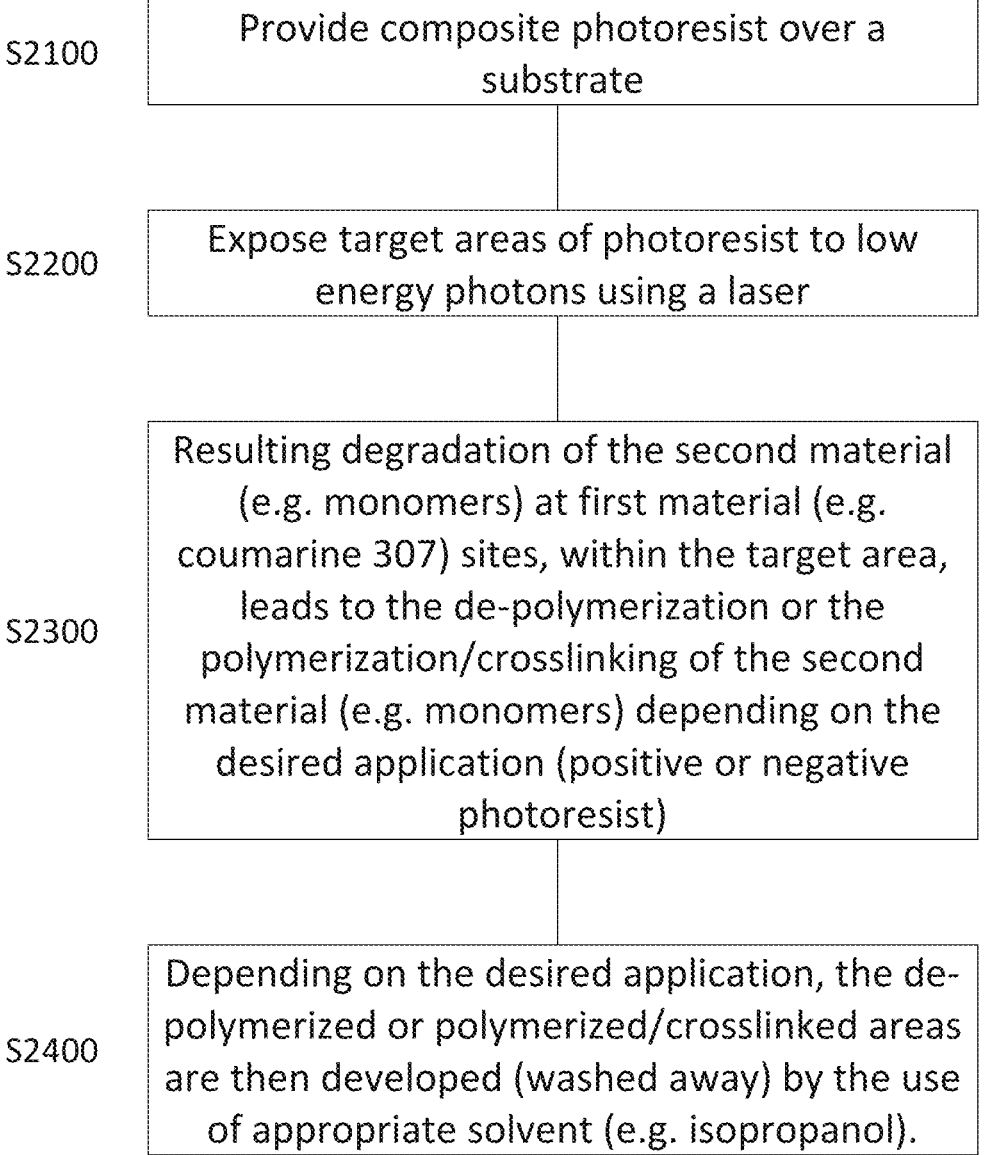

S2100 — Provide composite photoresist over a substrate

S2200 — Expose target areas of photoresist to low energy photons using a laser

S2300 — Resulting degradation of the second material (e.g. monomers) at first material (e.g. coumarine 307) sites, within the target area, leads to the de-polymerization or the polymerization/crosslinking of the second material (e.g. monomers) depending on the desired application (positive or negative photoresist)

S2400 — Depending on the desired application, the de-polymerized or polymerized/crosslinked areas are then developed (washed away) by the use of appropriate solvent (e.g. isopropanol).

Figure 3

Intensity

Threshold

Coumarin 307                    Trimethylolpropane triacrylate

|  | Power mW | Irradiance MW/cm^2 | Energy uJ | Photon |
|---|---|---|---|---|
| CW REF | 100 | 18.0387 | 100000 | 1.89e+17 |
| CW EXF | 100 | 18.0387 | 100000 | 1.89e+17 |

|  | kW | TW/cm^2 | nJ |  |
|---|---|---|---|---|
| PULSE | 0.2538 | 35.9061 | 0.027016 | 5.10e+07 |

PHOTOEXCITATION METHOD

CROSS REFERENCES TO RELATED APPLICATIONS

This patent application is a Continuation-In-Part (CIP) application of commonly owned U.S. patent application Ser. No. 16/081,777, entitled: Photoexcitation Method, filed on 31 Aug. 2018, which is a § 371 of commonly owned patent application PCT/GB2016/050575, filed on 4 Mar. 2016, the disclosures of both applications are incorporated by reference, in their entirety herein.

FIELD OF INVENTION

The invention relates to improvements in photoexcitation. Particularly, but not exclusively, it relates to methods of photolithography and composite photoresists.

BACKGROUND TO THE INVENTION

Manufacturing of nanometer scale structures has applications in a wide range of fields. Progress in the semiconductor industry is driven by reducing the Minimum Feature Size attainable by photolithography. Technological advancement in the fields of photonics, meta-surfaces and MEMs/Sensors is similarly reliant on this Minimum Feature Size/Critical Dimension (CD) shrinkage.

In general, the minimum feature size of a lithographic process is limited by the wavelength of the light used.

High Volume Manufacturing (HVM) for semiconductor applications is typically carried out through the use of mask-based/projection photolithography tools (steppers and scanners), where the geometry of the features/patterns to be generated is originally available on a Mask. Light is projected through the Mask on a photoresist carrying substrate, chemically altering the photoresist residing under the areas of the Mask that are optically transparent—and thus reachable by the (exposing) light.

Ultraviolet (UV) photolithography is the most commonly employed HVM patterning method (using 193 nm wavelength light), whilst the next generation of lithographic techniques: Extreme UV (EUV) photolithography, using 13.5 nm wavelength light, is rapidly gaining traction since its first commercial introduction in 2019-2020.

The use of high energy, low wavelength lasers have a number of associated disadvantages including unwanted absorption in air (with such systems therefore requiring expensive and complicated vacuum environments), collateral damage to the sample, and ionisation and charging of certain materials. Equally, low wavelength lasers suffer from a low depth of focus which restricts the thickness of the photoresist and the depth of topography of the etched substrate below, so the ability to achieve high resolution lithography without the need for high energy lasers is desirable.

Low Volume Manufacturing (LVM) on the other hand is typically carried out through the use of maskless/direct-write tools, either utilizing a laser beam or an electron beam to directly/selectively expose the photoresist (reached by the/ that exposing beam), chemically altering parts of it, without using a Mask—For applications requiring sub-100 nm resolution, electron-beam lithography is used almost exclusively.

Low Volume Manufacturing (LVM) has been traditionally using common, to High Volume Manufacturing, processes and materials (including but not limited to photoresists) in order to benefit from the investments, progress and know-how accumulated by and through High Volume Manufacturing.

This widely accepted by the industry 'modus operandi' overlooked a critical characteristic of laser-based maskless/ direct-write photolithography tools: The Gaussian intensity profile of their exposure beams. (Mask-based/projection lithography tools are uniformly illuminating the Mask and, through the Mask, the underlying photoresist)

For the last three decades—at least—, the use of laser-based, maskless/direct-write photolithography has been limited, by its attainable Minimum Feature Size/Critical Dimension capabilities, to manufacturing geometries in the range of (typically) 1 μm or (advanced) 0.5 μm.

The laser ablation of polymeric films has been proposed as an alternative lithographic approach for direct write/LVM applications. Despite extensive investigations, the best resolution in laser ablation processes has been limited to dimensions above 1 micron and only recently has submicron resolution been demonstrated, typically requiring the use of high energy, femtosecond lasers. Similarly, whilst investigations have been made regarding the applications of polymers, polyimides and dye doped systems to laser ablation processes, the use of organic polymers as lithographic materials in laser ablation processes has been limited to low resolution applications.

An object of the present invention is to mitigate some of the deficiencies of the prior art, advancing the Minimum Feature Size/Critical Dimension capabilities of maskless/ direct-write photolithography processes by a factor of 10 or more—applicable both in laser ablation and 'conventional' positive-tone/negative-tone photolithography applications—through detailing tool design and a photoexcitation method to be used in photoresist synthesis

SUMMARY OF THE INVENTION

In a first aspect of the invention, there is provided a method of photoexcitation comprising the steps of providing a composite, the composite comprising a first material having at least a first energy level and a second energy level, and a second material having at least a first energy level and second energy level, wherein the energy gap between the first and second energy level of the first material is less than the energy gap between the first and second energy level of the second material, and wherein the first material and second material are in communication with one another; providing a photon source configured to emit a photon, wherein the energy of the photon is equal to or greater than the energy gap of the first material but less than the energy gap of the second material, exposing the composite to the photon such that an electron is excited from the first energy level of the first material to the second energy level of the first material, and wherein said electron transfers from the second energy level of the first material to the second energy level of the second material.

Providing a composite with the energy level structure described above allows for an electron to be excited into the second energy level of the second material indirectly via a lower energy excitation in the first material. This lower energy excitation requires less energy than a direct excitation from the first energy level of the second material to the second energy level of the second material, and can be accomplished using photons with an energy lower than the energy gap of the second material. As such, the need for high energy photons (photons with an energy equal to or greater than the energy gap of the first material) is obviated, along with their associated disadvantages as noted above.

Typically the second energy level of the first material is substantially equal to the second energy level of the second material. This improves the ease of electron transmission between the first and second materials.

The term 'energy level' refers to the quantised, discrete values of energy of bound particles in quantum mechanical systems, typically electrons. These include the lowest energy level, otherwise known as the ground state or zero point energy. These levels may also be referred to as energy shells or simply shells. The 'first energy level' described above for both the first and second material may be the ground state i.e. the zero point energy of the materials or a higher energy level. The first and second energy levels of the first and second materials do not necessarily need to be the lowest and highest energy levels associated with those materials respectively. It is however typically the case that the second energy is higher than the first energy level in a given material.

Further the 'energy gap', referred to herein is the energy range, or the distance in energy space between the discrete energy levels defined above. This could also be described as the difference in energy between two discrete energy levels.

Reference to 'electron transfer' in the specification refers to the process by which the electron in the second energy level of the first material moves to the second energy level of the second material. This may also be referred to as 'energy transfer', 'photosensitization' or the first material donating an electron, the second material receiving an electron, or the second material absorbing energy from the first material.

It is important that the first and second material are 'in communication' with each other. The skilled person will appreciate that if the first and second materials are isolated from one another, it is not possible for any electron transfer to occur. Therefore, the term, 'in communication' is intended to describe that the first and second materials are able to transmit and receive respectively an electron as described above. Accordingly, the two materials could be connected via a single interface at which the reaction can occur or may involve dispersing one material within another to maximise the contact area between the two materials.

Typically the first material is dispersed uniformly throughout the second material. The particles of the first material may also be predominantly located in a particular area or plane or face of the second material. This facilitates electron transfer from the particles of the first material to the second material and defines the areas of the second material which receive an electron according to the distribution of the first material.

Typically the first material is bonded to the second material. For instance, the first material may be covalently bonded to the second material. This ensures close proximity between the first material and the second material. By attaching the first material to (e.g.) a polymer, ensures an even distribution of the first material throughout the second material and can provide for a sufficient density of the first material such that all of the second material can undergo indirect photoexcitation. Moreover, this prevents over-saturation and aggradation of the first material.

The term 'indirect photoexcitation', refers to the process by which the second material gains an electron in its second energy level via a photoexcitation from the first energy level of the first material to the second energy level of the first material.

Alternatively, the second material may be doped with the first material. This enables the concentration of the first material to be precisely controlled along with its precise distribution via methods such as selective doping. By better defining the location of the first material within the second material, one can vary the location and concentration of the resulting exposed portions of the second material and the resulting features on the substrate.

Typically the first material further comprises one or more intervening energy levels between the first and second energy levels of the first material and wherein the energy of the photon is equal to or greater than the energy gaps between each of the energy levels of the first material but less than the energy gap of the second material.

Reference to 'intervening energy levels', is intended to mean energy levels located on the energy scale between the first and second energy levels of the first material.

This enables an electron to reach the second energy level of the first material by a series of smaller steps through the energy levels in the first material. Once promoted to the second energy, via the intervening energy levels, the electron can transfer from the first material to the second energy level of the second material. By providing more 'rungs' to this energy level ladder, an electron can be excited up the levels by a plurality of photons each photon having a much lower energy than the energy gap between the first and second energy levels of the second material, in what is called a multi-stage photoexcitation. These lower energy photons are easier to generate and, unlike high energy photons, do not cause collateral damage to material, are not absorbed by air and have a good depth of focus.

This multi-stage photoexcitation process requires the photon flux to be above a certain threshold such that electrons in the first material can be continually promoted into higher excited states (i.e. gaining higher energy levels) until they can transfer into the second material, without decaying back down to their initial, unexcited energy state, or ground state.

The term 'low energy photons' or 'lower energy photons', is intended to describe photons having an energy less than the energy gap between the first and second energy levels of the second material. In other words, photons that are incapable of directly exciting an electron from a first energy level of the second material into a second energy level of the second material.

Typically the photon source is a laser. This allows for the provisions of a controllable source of photons of consistent energy. Further, the exposed area of the composite can be set by the spot size of the laser. Both the spot size and/or the wavelength of the laser can be varied as desired. Furthermore, the pulse duration and/or pulse amplitude of the laser can also be varied.

By varying these parameters, it is possible to vary the exposure of the composite material and adjust the dimensions of the resulting features on the substrate. There is no particular limitation on the photon source used and indeed the use of any source of a focused light beam is envisaged. As discussed herein, a threshold exists in the photon flux, above which the photosensitization process will commence. By using a photon source which has a Gaussian beam profile, the photon source can be tuned such that only the very centre of the beam is above this threshold.

This allows for the photosensitization of an area of the second material smaller than the spot size of the photo source [FIG. 8 and—in detail—FIG. 9 for a 35 nm radius area]. In the case where the composite is a photoresist used in photolithography, this leads to an increase in the resolution of the features attainable.

Typically the laser is operated in a continuous wave mode. This provides a steady, constant and controllable stream of photons to the composite.

Typically the laser is a diode laser. Diode lasers typically require less power than most gas or chemical laser systems.

Typically the first material is an aromatic molecule. Typically a polyaromatic molecule. The inventors have found that such molecules are useful photosensitizers, having an energy level structure that makes it well suited as a first material in the claimed invention.

Typically the first material is a dye. The term 'dye' is intended to refer to any compound which has an energy level structure as described above for the first material. Typically, the 'dye' is an organic dye. Reference to 'organic dye' is intended to cover those compounds containing a chromophore i.e. a group responsible for producing colour. Typically, these groups are aromatic regions of a molecule which absorb radiation. Although term 'chromophore' typically relates to regions responsible for colour, it is also envisaged that such groups may be suitable for absorbing radiation outside the visible spectrum.

Typically the dye is a perylene or a coumarin Typical examples of dyes include aminoanthracene or anthracene. The inventors have found that these molecules have an energy level structure that makes them well suited as a first material in the claimed invention. Reference to 'perylenes' or 'courmarins' herein is intended to cover the specific compound (e.g. perylene) and also those compounds including said compounds, usually as a chromophore, such as perylene-3,4,9,10-tetracarboxylic acid ('Vat Red 29') as well as derivatives of said compounds.

The first material may be provided as particles. Alternatively, the first material may be provided in a molecular form, for instance as a liquid or as a solution in which the first material is dissolved.

In one embodiment, the first material may be nanoparticles associated with a particular functionality of the second material.

The ratio of the first material to the second material in the composite is not particularly limited. However, it is typically the case that the amount of second material is greater than the amount of first material. Typically, the composite comprises less than 50% by weight of the first material, more typically in the range 1 to 10%.

Typically the second material is one of a polymer, photo acid generator, photo radical generator, photo base generator or other photodegradable material. When these materials are exposed to high energy electrons via the claimed energy transfer mechanism (or sensitised), this typically promotes a chemical change via the breaking of chemical bonds. Accordingly, the process can be used to impart electrons to very small regions of the second material thereby promoting chemical changes in very specific regions of the second material.

There is no particular limitation on the material used and indeed other such molecular materials are envisaged that have bonds which can be broken using this electron transfer mechanism. Similarly mixtures of one or more polymers, photo acid generators, photo radical generators and photo base generators are also envisaged. The polymer may be a co-polymer, such as a block or random copolymer. The polymer may be functionalised to include moieties adapted to receive an electron or react on receipt of an electron from the first material.

Examples of typical polymers suitable for use in the present invention include, but are not limited to; polyacrylates, polyamides, polyimides, polyesters, polyethers, or combinations thereof.

Examples of typical photo-acid generators suitable for use in the present invention include, but are not limited to; sulfonium salts, iodonium salts, sulfonates, naphthalimides or combinations thereof.

Examples of typical photo-radical generators suitable for use in the present invention include, but are not limited to; peroxides, nitriles, halides, ketones, diketones, phenones, esters, ethers or combinations thereof. Monomers can also act as photoradical generators given that, when exposed to high energy electrons via the claimed energy transfer mechanism, will degrade generating a radical.

Examples of typical photo-base generators suitable for use in the present invention include, but are not limited to; thioxanthones, carbamates, acyloximes, ammonium salt, aminoketones or combinations thereof Typically the first material-second material composite is a photoresist. Typically, the photoresist is deposited over a substrate. When the second material receives an electron into its second energy level it becomes chemically differentiated from the rest of the photoresist.

Depending on the desired application and the second material, this chemically differentiated material may either be developed and removed leaving the unexposed material on the substrate (in the case of a positive photoresist—FIG. 7c and FIG. 20), or remain on the substrate whilst the unexposed photoresist is removed (in the case of a negative photoresist—FIG. 6c and FIG. 19), or preferably degrade in situ as a result of the absorbed energy and expose the underlying substrate to further processing (such as ablation by the photon source—FIG. 5b and FIG. 18), allowing for direct laser writing of the substrate, with fewer processing steps than conventional photolithography.

The present invention utilizes the unique (Gaussian) intensity profile characteristics of laser-based maskless/direct-write photolithography tools to advance their resolution (shrink their attainable Minimum Feature Size) by a factor of ×10 or more, detailing tool design and a photoexcitation method to be used in photoresist synthesis.

The present invention particulates a) the ablation-based/in situ degradation application (Experimental 2.1—U.S. patent application Ser. No. 16/081,777) and b) the non-ablation-based/negative tone photoresist application (Experimental 2.2) that requires further processing steps for feature formation (specifically: development)—for sub-100 nm laser-based photolithography.

According to another aspect of the present invention there is provided a method of photoexcitation. The method including forming a composite layer of at least a first material and a second material onto a substrate; the first material has at least a first energy level, a second energy level, and at least one interceding energy level between the first and second energy levels; the second material has at least a first energy level and a second energy level, wherein the second material is photodegraded when at least one electron is excited into the second energy level of the second material, wherein an energy gap between the first energy level and the at least one interceding energy level of the first material is less than the energy gap between the first and second energy level of the second material, and wherein the first material and second material are in communication with one another; —exposing predetermined areas of the composite material to photons emitted from a laser source at an operational wavelength; exposing predetermined areas of the composite by focusing the laser source on the composite layer to: Excite at least one electron from the first energy level of the first material to the at least one interceding energy level; Excite the at least one electron from the at least one interceding energy level to the second energy level of the first material; and transfer the at least one electron from the second energy level of the first material to the second energy level of the second material to cause degradation of the second material at the exposed by the laser portions of the substrate.

The composite material can be a photoresist. The first material can include a perylene and the second material includes a polymer. The first material can include a coumarin 307 and the second material includes a monomer, an oligomer or a small molecule. The laser can be a continuous wave laser and operates at the wavelength of approximately 375 nm.

Exposing the composite to the laser can cause degradation of the second material within the composite in areas with dimensions below the operational wavelength of the laser.

Other aspects of the invention will be apparent from the following description, examples and the appended claim set.

BRIEF DESCRIPTION OF THE DRAWINGS

Embodiments of the present invention will now be described, by way of example only, with reference to the accompanying drawings, in which:

FIG. 3 is a flow chart of the method in accordance with an embodiment of the invention. (Positive/Negative Photoresist Application)

DESCRIPTION

1. Detailed Description

In order to provide for indirect photoexcitation whereby a large energy gap between energy levels in a second material is circumvented by a series of lower energy photoexcitations in a first material, there is provided a method of photoexcitation in accordance with the present invention.

1.1 Laser Ablation/In Situ Degradation Application

Figure 1:
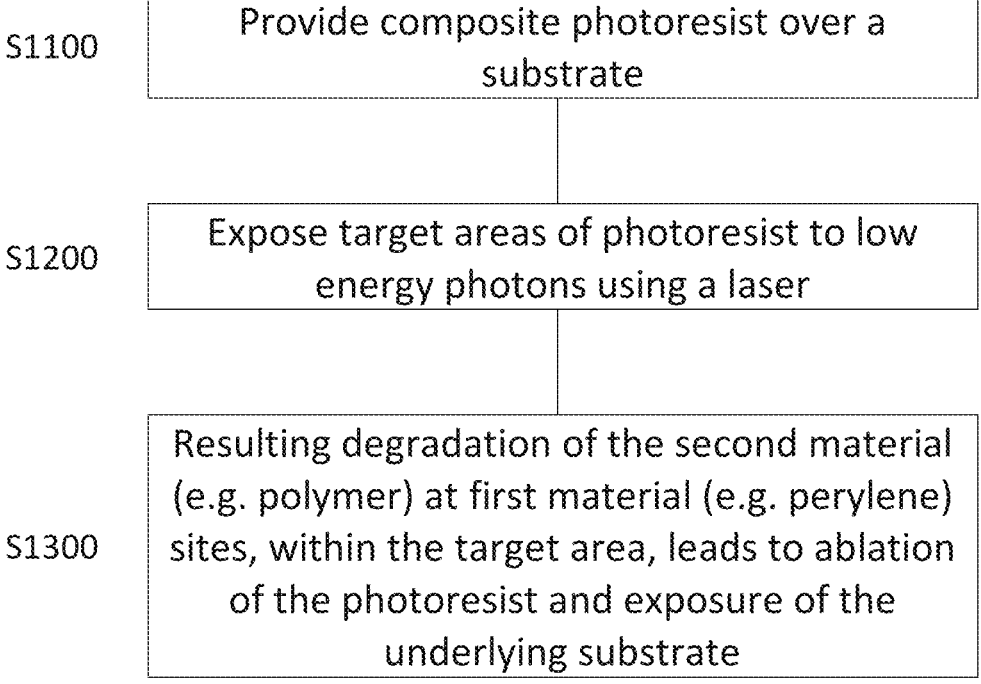
FIG. 1 is a flow chart of the method in accordance with an embodiment of the invention. (In Situ Degradation Application)

FIG. 1 shows a flowchart of the method steps performed to achieve photoexcitation according to an embodiment of the invention.

The process commences at step S1100 wherein a composite 10 is provided as a photoresist 20 spin coated onto a substrate 30. The composite 10 is formed of perylene (first material) molecules 40 in a polymer (second material) 50 matrix.

At step S1200, targeted areas of the composite 10 are exposed to low energy photons 60 provided by a laser 70. The Laser 70 is a 375 nm diode laser operating in continuous wave mode. The laser 70 is focused to provide a diffraction limit spot size on the surface of the composite 10, defining the target area. The perylene (first material) molecules 40 within this area absorb photons having an energy related to in the exposing laser wavelength, whereas the polymer (second material) 50 is transparent.

At step S1300, the polymer (second material) 50 matrix around the sites of the perylene (first material) molecules exposed to the low energy photons 60 from the laser 70 undergoes polymer degradation leading to ablation of the photoresist 20, exposing the underlying substrate 30 to the laser 70 and allowing the substrate 30 to be patterned directly. The resulting features created on the substrate 30 have dimensions below the 50 nm domain, well below the laser wavelength.

Without being bound by theory, it is believed that the first material (perylene) molecules 40 absorb the low energy photons 60 and undergo a multi-stage photoexcitation. In this multi-stage photoexcitation, an electron occupying an energy level in a first material (perylene) molecule 40 absorbs an incident low energy photon 60 and is promoted to a higher energy level (and therefore gaining energy). The continuous wave nature of the laser 70 allows for this electron to undergo further photoexcitations before it is able to re-emit the low energy photon 60 and return to its original energy level. This is enabled by the photon flux being above a threshold necessary for continuous electron promotion. Therefore the electron continues to advance upward through energy levels (and energy) until it occupies an energy level of the first material (perylene) molecule 40 that is substantially equivalent in energy to an energy level of the surrounding second material (polymer) 50. At this stage, the electron transfers from first material (perylene) molecules 40 into the surrounding second material (polymer) 50 which then degrades. Thus the second material (polymer) 50 is photosensitized by the first material (perylene) molecule 40, which acts as a photosensitizer. Accordingly the minimum feature size is not set by the laser 70 wavelength, but by the size and distribution of the absorbing first material (perylene) molecules 40 and the characteristic distance over which the high energy electron can transfer between the first material (perylene) molecule 40 and the surrounding second material (polymer) 50.

The composite 10 is formed by doping the polymer 50 with 5% perylene (with respect to the polymer weight).

1.2 Non-Laser Ablation/Negative Tone Photoresist Application

FIG. 3 shows a flowchart of the method steps performed to achieve photoexcitation according to an embodiment of the invention.

The process commences at step S2100 wherein a composite 20 is provided as a photoresist deposited onto a substrate 30.

In one embodiment of the invention the first material is a dye and the second material is a polymer.

In one embodiment of the invention the first material is a dye and the second material is a photo base, photo radical, photo acid generator or a mixture containing a photo base, photo radical, photo acid generator.

In one embodiment of the invention the first material is a dye and the second material is a monomer, oligomer, small molecule acting as a photo radical generator.

In one embodiment of the invention the first material is/are coumarin 307 molecules 40 and the second material is/are Trimethylolpropane triacrylate 50 monomers.

Depending on the desired application, in one embodiment of the invention, the developing solvent is isopropanol.

At step S2200, targeted areas of the composite 20 are exposed to low energy photons 60 provided by a laser 70. The Laser 70 is a 375 nm diode laser operating in continuous wave mode. The laser 70 is focused to provide a diffraction limit spot size on the surface of the composite 20, defining the target area. The coumarin 307 (first material) molecules 40 within this area absorb photons having an energy related to in the exposing laser wavelength, whereas the monomers (second material) 50 are transparent.

At step S2300, the monomer (second material) bulk 50 around the sites of the coumarin 307 (first material) molecules exposed to the low energy photons 60 from the laser 70 undergoes degradation leading to the formation of radicals that then cause surrounding monomers to polymerize, becoming insoluble to isopropanol. The resulting polymerized areas on the substrate 30 have dimensions below the 50 nm domain, well below the laser wavelength.

Without being bound by theory, it is believed that the first material (coumarin 307) molecules 40 absorb the low energy photons 60 and undergo a multi-stage photoexcitation. In this multi-stage photoexcitation, an electron occupying an energy level in a first material (coumarin 307) molecule 40 absorbs an incident low energy photon 60 and is promoted to a higher energy level (and therefore gaining energy). The continuous wave nature of the laser 70 allows for this electron to undergo further photoexcitations before it is able to re-emit the low energy photon 60 and return to its original energy level. This is enabled by the photon flux being above a threshold necessary for continuous electron promotion. Therefore the electron continues to advance upward through energy levels (and energy) until it occupies an energy level of the first material (coumarin 307) molecule 40 that is substantially equivalent in energy to an energy level of the surrounding second material (monomers) 50. At this stage, the electron transfers from first material (coumarin 307) molecules 40 into the surrounding second material (monomer) 50 which then degrades. Thus the second material (monomers) 50 are photosensitized by the first material (coumarin 307) molecule 40, which acts as a photosensitizer. Thus the photosensitized second material (monomers) 50 degrade generating a radical, acting as a photo radical generator. Accordingly the minimum feature size is not set by the laser 70 wavelength, but by the size and distribution of the absorbing first material (coumarin 307) molecules 40 and the characteristic distance over which the high energy electron can transfer between the first material (coumarin 307) molecule 40 and the surrounding second material (monomers) 50.

The composite 20 is formed by dispersing monomers 50 with 0.5% coumarin 307 (with respect to the monomer weight).

Figure 2A:
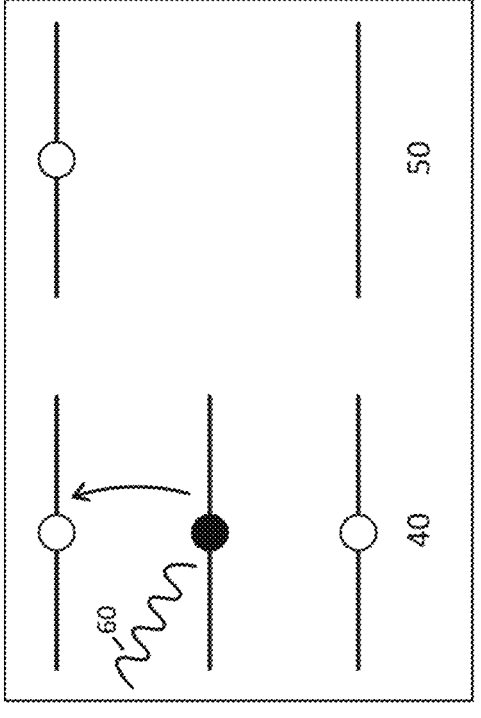
FIGS. 2A-2D is an energy level schematic of the composite.
Figure 2B:
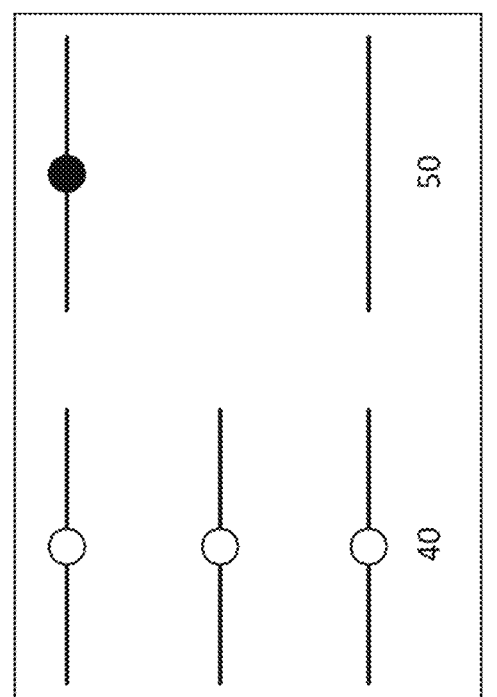
Figure 2C:
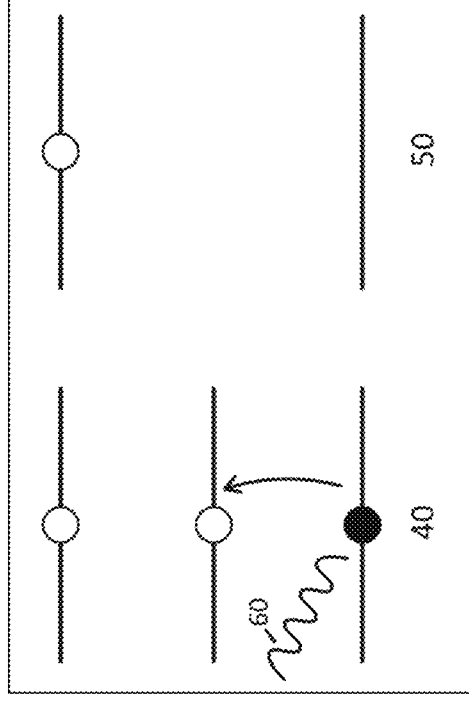
Figure 2D:
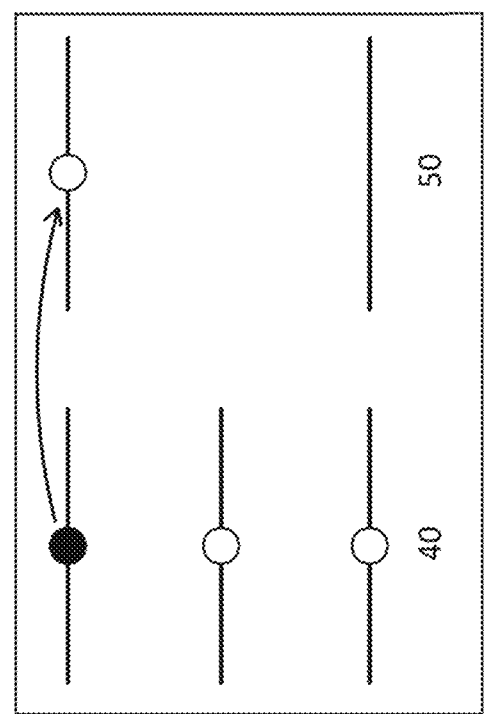

The process for both applications (1.1 and 1.2) is illustrated in FIG. 2a-2d which shows an energy level schematic of the first material 40 and second material 50. FIG. 2a show the first stage of the process, with an electron in the first material 40 undergoing photoexcitation to the energy level above. This is repeated in FIG. 2b, with the electron continuing up the energy levels. FIG. 2c shows the now high energy electron being transferred between an energy level of the first material that is substantially equal in energy to an energy level of the second material 50, thus the second material 50 absorbs the high energy electron.

Figure 4:
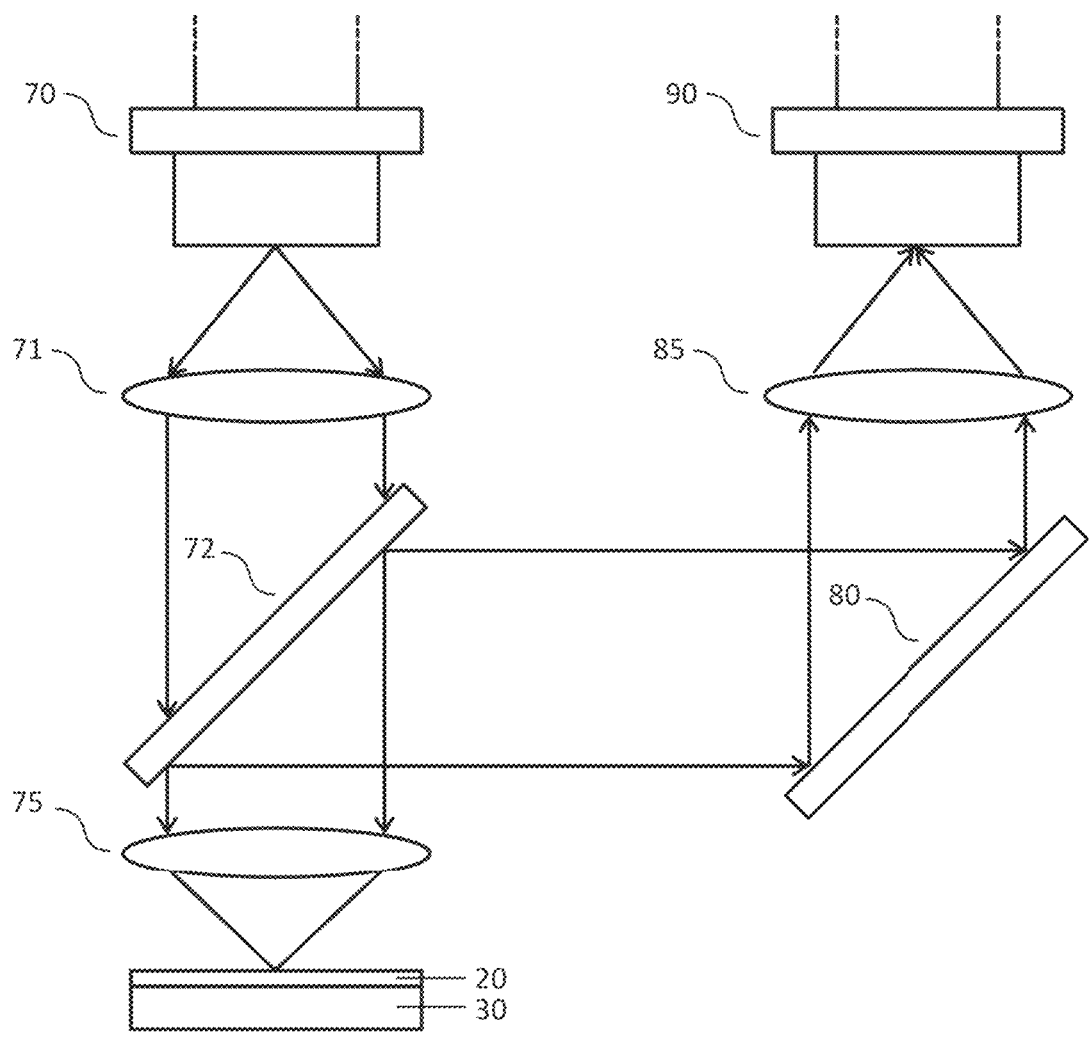
FIG. 4 is a schematic drawing of the laser writing setup. (All Applications)
Figure 5A:
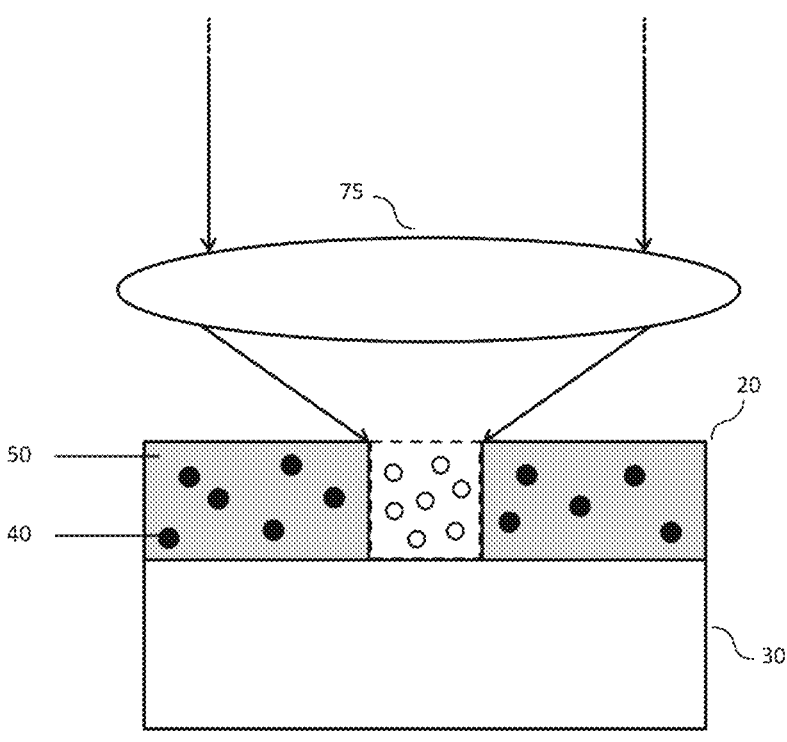
FIG. 5A is an illustration of high resolution structure formation by using only a small part of the laser focussed spot on a composite deposited onto a substrate. (All Applications)
Figure 5B:
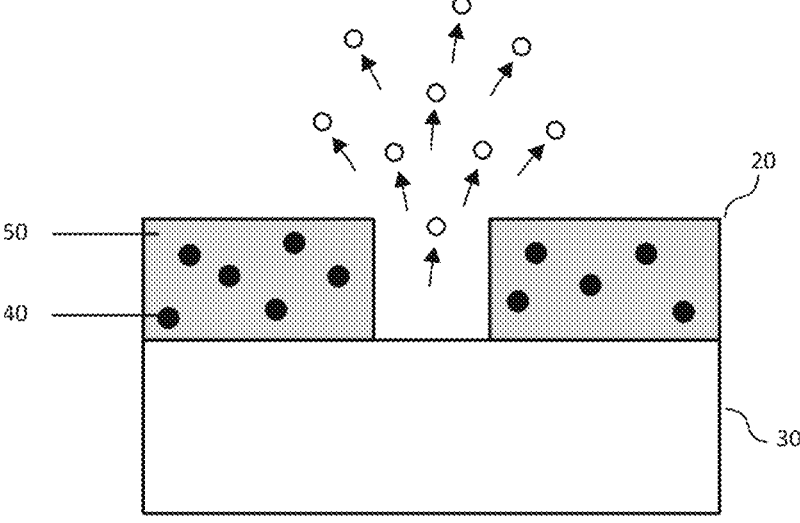
FIG. 5B is an illustration of the In Situ Degradation/Ablation Application
Figure 6A:
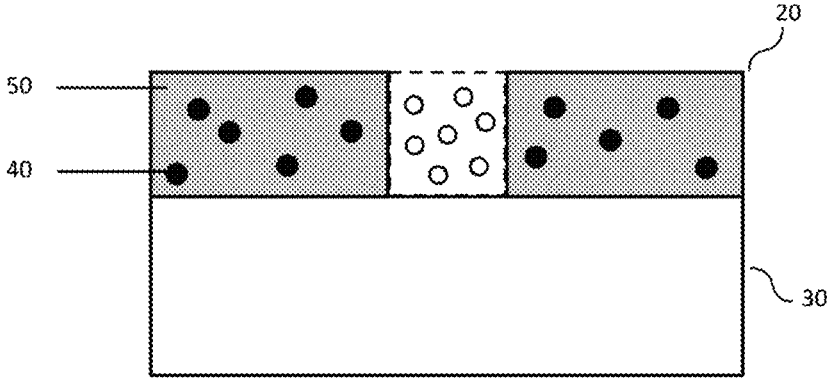
FIG. 6A to 6C are illustrations of the Positive Photoresist Application
Figure 6B:
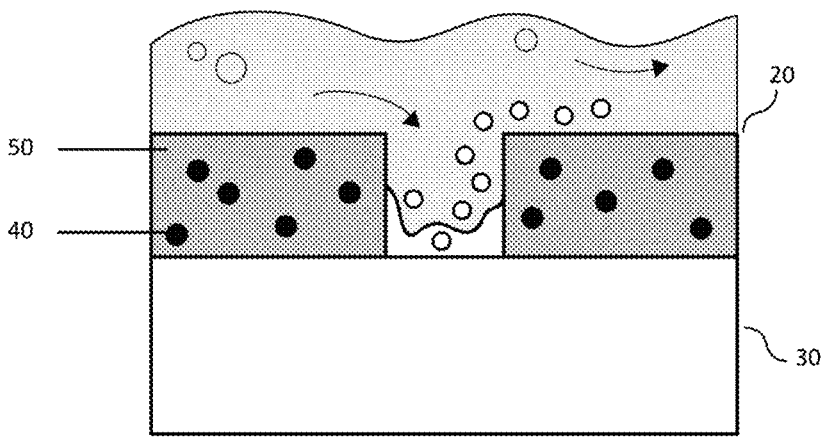
Figure 6C:
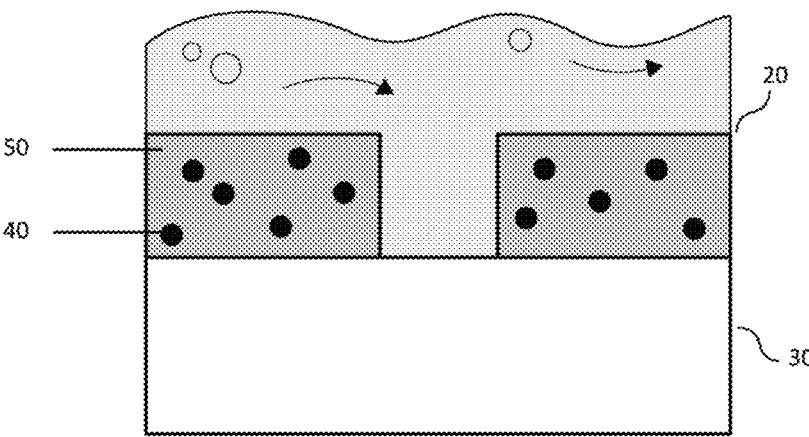
Figure 7A:
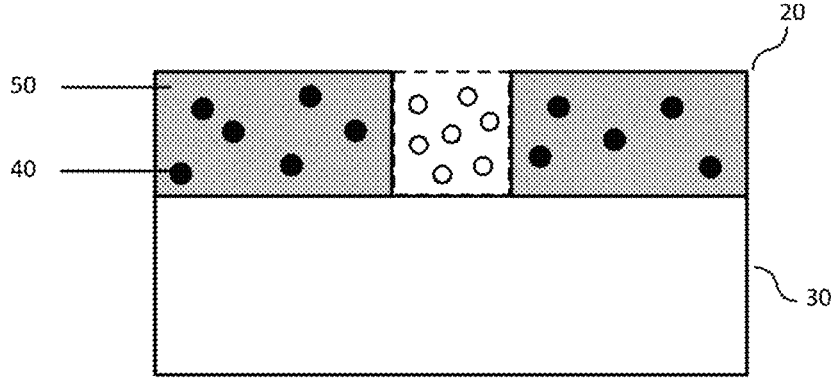
FIG. 7A to 7C are illustrations of the Negative Photoresist Application
Figure 7B:
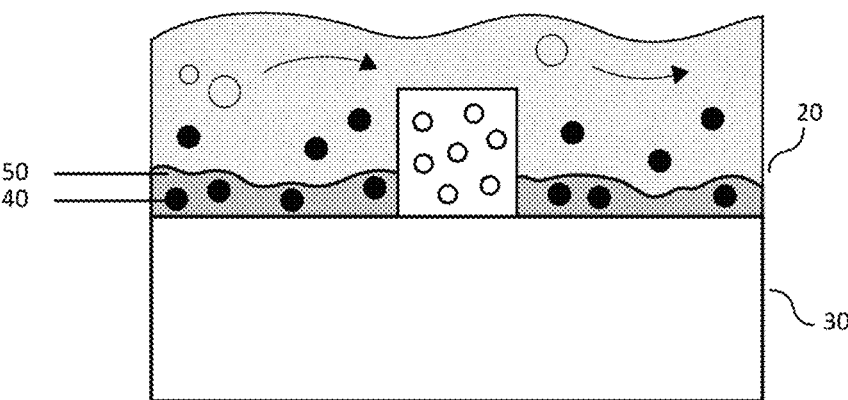
Figure 7C:
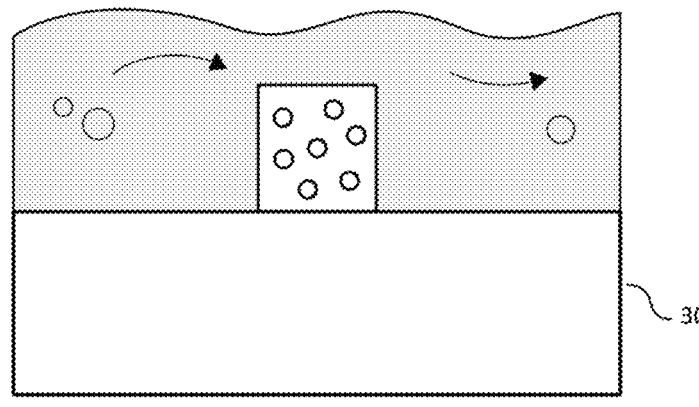

FIG. 4 shows the laser setup used in both applications (1.1 and 1.2). The direct-write system used to selectively expose the photoresist incorporated an air-bearing/precision mechatronic stage. A rotary spindle carried the coated spin-coated substrate by means of a vacuum clamp, a linear stage translated the laser 70 and optics above and across the substrate, and a focussing actuator held the high numerical aperture (NA) objective lens 75 properly positioned.

An exposing laser beam from the 375 nm diode laser was collimated using a lens 71, passing through a partial mirror 72, before being precisely focused onto the surface of the photoresist 20 through the high NA objective lens 75 and the beam was rastered over the desired areas of the photoresist and the underlying substrate.

Light reflected off of the composite 20 to the partial mirror 72 is directed by a second mirror 80 through a second lens 85 into a photo detector 90 to allow for feedback driven autofocusing of the laser 70.

EXAMPLES

2. Experimental

2.1 Laser Ablation/In Situ Degradation Example

2.1.1 Materials

All solvents and reagents were purchased from Sigma or Alfa Aesar and were of analytical or HPLC grade.

Tetrahydrofuran (THF) was distilled three times from potassium. The monomers were passed over a column of basic alumina to remove the inhibitors and protonic impurities. Two distillations over calcium hydride and 2,2-Diphenyl-1-picrylhydrazyl (Aldrich) provided monomers of sufficient purity.

2.1.2 Polymerizations

Polymerization reactions were carried out in 250 ml one neck flasks fitted with a rubber septum and a magnetic stirrer bar. The monomers and the solvent (typically tetrahydrofuran (THF)) were transferred in the reaction flask via syringes. Then, the radical initiator (typically AIBN Azobisisobutyronitrile) was added and the flask were heated at 60° C. The polymerizations were being carried out for 8 hours. The final polymer was obtained by precipitation of the reaction mixture in cold hexane and the product was dried under reduced pressure.

2.1.3 Substrate Preparation

Glass substrates were cleaned by sonication in acetone and isopropanol for 5 min each, dried under a $N_2$ gas flow and baked for 2 min at 120° C. in an ambient atmosphere to remove any residual IPA. The random copolymers were dissolved in ethyl lactate and PGMEA at room temperature to yield 2.0, 3.0 and 5.0 wt % polymer solutions. Random copolymer thin films were fabricated by spin coating a polymer solution at 1000-2000 rpm for 120 seconds. Prior to spin coating, the silicon substrates were primed 2 times by spin casting ethyl lactate or PGMEA (2000, 120 seconds). After spin coating, the block copolymers thin films were baked for 30 min at 100° C. on an oven to remove any residual solvent.

2.2 Non-Laser Ablation/Negative Tone Photoresist Example

2.2.1 Materials

All solvents and reagents were purchased from Sigma or Alfa Aesar or TCI and were of analytical or HPLC grade.

2.2.2 Substrate Surface Modification

Glass substrates 30 were cleaned and activated by immersion in piranha solution (3:1 mixture of sulfuric acid and 30% hydrogen peroxide) for 30 min and were then removed and rinsed extensively with ultrapure DI water and isopropanol. The substrates 30 were dried under a $N_2$ gas flow and placed in a vacuum oven to dry. Subsequently, they were immersed in a 2 v/v % solution of the 3-(Trimethoxysilyl) propyl methacrylate (MAPTMS), in anhydrous toluene. After 24 h, the substrates 30 were removed from the solution, washed with toluene and isopropanol, to remove the unattached MAPTMS, followed by drying with a $N_2$ gas flow. After the treatment, a self-assembly monolayer of MAPTMS was deposited in the glass surface in order to introduce methacrylate groups in the outer surface. The methacrylate groups of MAPTMS will be polymerized/crosslinked with the laser processed areas of the composite 20, covalent bonding them with the glass substrate.

2.2.3 Substrate Preparation

Coumarin 307 (5.0 mg) was dissolved in 1 g trimethylolpropane triacrylate. This corresponds to 0.5% w/w. The mixture is stirred on a stirrer at room temperature for 4 h until all the compounds have dissolved. A small droplet of the composite 20 was deposited on a MAPTMS modified glass substrate 30 and was placed in a vacuum oven for ~5 h to remove the oxygen.

2.3 Laser Writings (Common to Both Examples)

The direct-write laser system used to selectively expose the composite 20 was an air-bearing/precision mechatronic stage, developed in-house for the purposes of the project, in r-theta-z setup. A rotary spindle carried the composite 20 coated substrate 30 under test (theta)—by the means of a vacuum clamp—, a linear stage (r) translated the laser and optics above theta and across the substrate radii, and a focusing actuator (z) held the final/high-NA objective properly positioned.

The film exposing laser beam (375 nm diode laser) was precisely focused, through a high NA objective, resulting in the formation of a diffraction limited spot on the surface of the substrate. Throughout the experimentation process a better than 1% (±0.5%) focusing error was maintained, using the focused spot FWHM diameter as a reference, and measuring error in the back-reflected (from the test substrate) beam divergence variation.

The optical arrangement used to setup and focus the exposing laser beam was individually tested for beam astigmatism and Gaussian beam profile uniformity along X and Y axes, and corrected. The setup used for testing involved focusing the exposing beam on a two (10× and 100×) infinity corrected microscope objective system, effectively magnifying it by three orders of magnitude, and projecting the up-scaled beam to a beam profiling camera (Neutral Density filters were additionally used to adjust laser power to profiling camera acceptable levels).

The combined rotary-linear motion of the exposure tool stages allowed the focused beam to scan the substrate surface with a constant linear velocity of 5.00 m/s in a spiral mode, while the exposing laser was directly modulated both in pulse duration and in amplitude, forming photodegraded areas with adjustable dimensions on the film.

The motion stage, beyond the practical use of manipulating the substrate and selectively positioning different areas of the composite film under the exposing beam, additionally acted as a heat dispassion mechanism for the substrate 30. Should heat is allowed to accumulate to the substrate 30, through the laser beam, acting on neighbouring areas of the composite 20, the uniformity of the geometry of the photodegraded areas will be affected and 'cross-talk' variations will be observed. When low speed motion stages are used, a water or gas cooled vacuum clamp can compensate for the lack of sufficient air flow on the surface of the composite 20 and the substrate 30. Forced air-flows, by the means of highly pure (particle free) air-jets or noble gas-jets, have also been successfully tested.

The power of the exposing laser varied from 40 to 80 mW. Within the given range of exposing laser power, various pulse modulation patterns were tested. The pulse duration/amplitude resolution of the exposure tool used was 10 ns/0.01 mW respectively.

2.4 Laser Power (Common to Both Examples)

Figure 9:
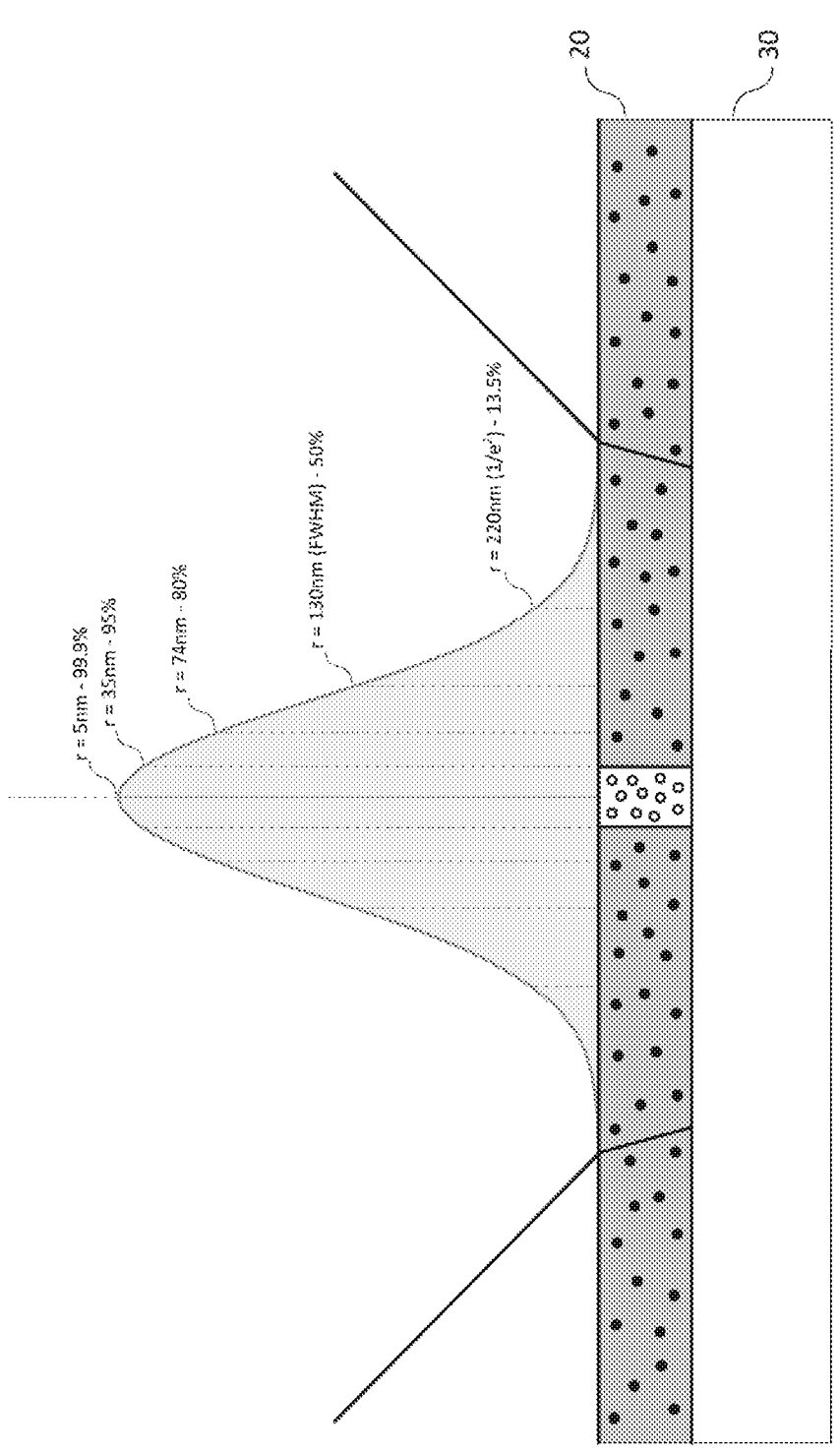
FIG. 9 is a detailed illustration of high resolution structure formation by using only a small (35 nm radius) part of the laser focussed spot on a composite deposited onto a substrate. (All Applications)

FIG. 9 shows the irradiance profile of the focused spot. Setting the laser source to output 40 mW of power, delivers 52.6 MW/cm2 of power density at radius 5 nm (diameter 10 nm) around the center of the focused spot and 52.5 MW/cm2 at radius 10 nm (diameter 20 nm). By maintaining better than 1% (±0.5%) focusing error on our 130 nm FWHM radius (230 nm diameter) spot, better than ±0.5% control of power density was possible to deliver across any given area of the composite 30.

By adjusting the source laser power, while keeping ±0.5% accurate focus (using the FWHM diameter as a reference), one can tune the exposure system to match any first material/second material combination electron transfer points, assuming that first material/second material combinations are properly selected or synthesized to have such electron transfer points.

2.5 Laser Modulation (Common to Both Examples)

The length of the created structures was adjusted by the duration and the modulation of the laser pulses, taking values from 10 to several hundred nanoseconds.

Figure 10A:
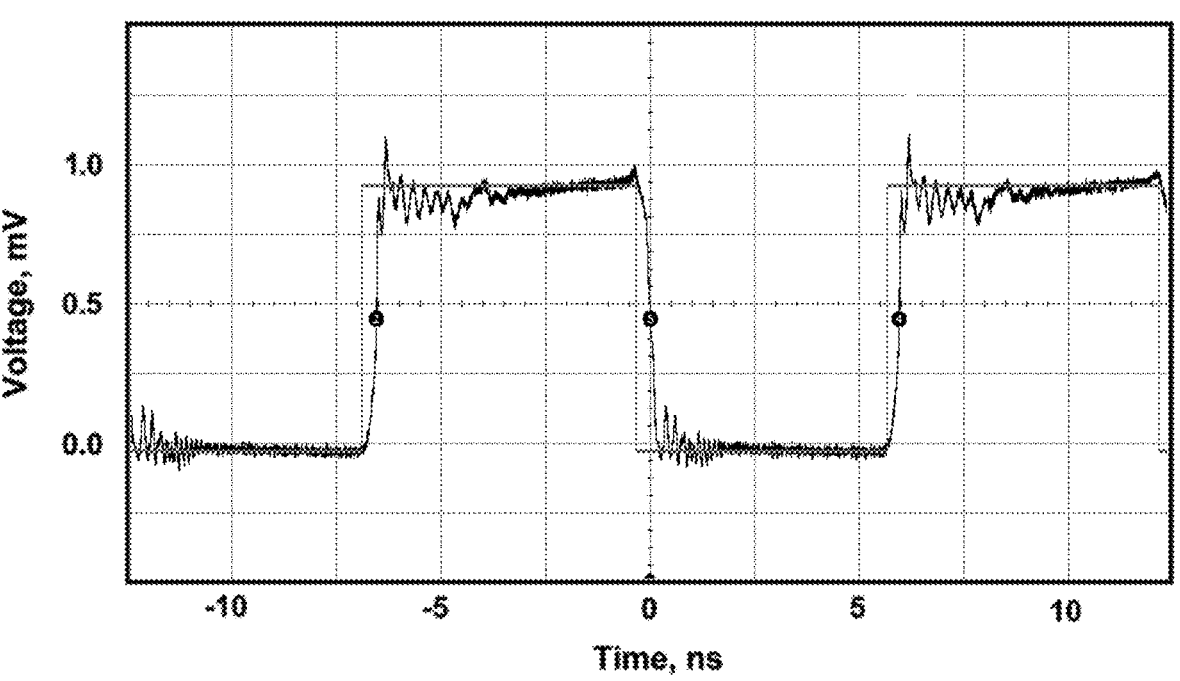
FIGS. 10A-10B shows the differences between generating 10 ns exposure pulses with a) modulating a Continuous Wave (CW) diode laser in accordance with the present invention, and b) using Pulsed Lasers instead. Illustration 10A from Experimental 2.1 and 2.2 herein. Illustration 10B from V N Lednev et al, Laser Phys. Lett 12 (2015)—please note nanosecond pulse is scaled down×20 in this illustration—
Figure 10B:
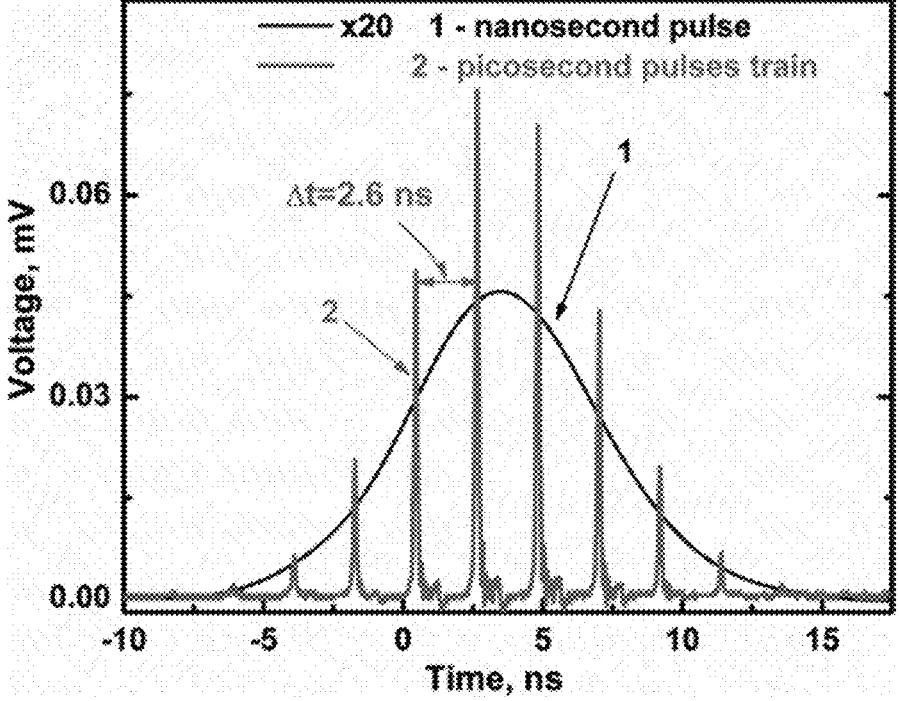

FIG. 10 shows the differences between generating 10 ns exposure pulses with a) modulating a Continuous Wave (CW) diode laser in accordance with the present invention, and b) using Pulsed Lasers instead.

Pulsed lasers deliver optical power in pulses of some duration and repetition rate. Typically ultrashort pulse lasers deliver optical power in 'pulse trains' of high-peak energy and ultra-short duration (picosecond and femtosecond scale). Pulsed lasers operating in the nanosecond scale deliver pulses temporally exhibiting Gaussian distribution profiles—FIG. 10b Our study has shown that pulsed lasers are too inaccurate in delivering low energy pulses in a predictable and repeatable way, both in spatial (beam pointing accuracy) and time (pulse start/duration) domains. Pulsed lasers also introduce a lot of uncertainty on generated feature placement (where exactly the exposure starts/ends and, as a result, where exactly the photodegraded areas of the composite 20 will be located).

Additionally, pulsed lasers worsen the control over delivering targeted photon energy fluxes to the composite 20 above a threshold necessary for continuous electron promotion according to the claimed energy transfer (or sensitisation) mechanism, making such control impossible (for ultrafast lasers) or impractical (for nanosecond pulsed lasers). For the claimed invention the use of modulated CW lasers (FIG. 10a) forms the basis of the laser writing system and modulated CW lasers should not be confused with Pulsed lasers.

2.6 Development (Depending on Application Requirements)

The substrate 30 carrying the exposed composite 20 was rinsed with a mild flow of isopropanol (10%) and ultrapure DI water mix for 30 seconds. The substrate 30 carrying the exposed, and now developed, composite 20 was then further rinsed with ultrapure DI water only, for another 60 seconds, to remove any traces of isopropanol for composite's 20 surface and then dried in a flow of $N_2$ gas.

3. Results and Discussion

3.1 Laser Ablation/In Situ Degradation Example

3.1.1 Materials Design and Properties

Figure 11:
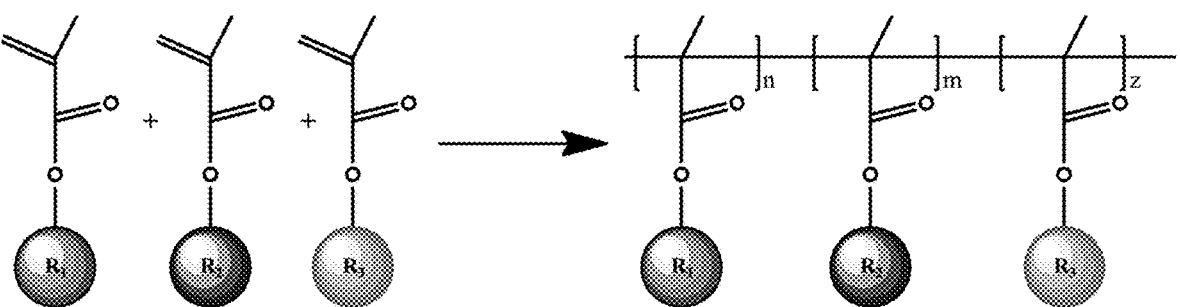
FIG. 11 is a representation of the formation of a copolymer useable in the invention. (In Situ Degradation/Ablation Application)

FIG. 11 shows the structure of the designed random copolymers synthesized by free radical polymerization. The monomers selected in the direction to improve specific properties of the final random copolymers. Random copolymers consisted of about 85% of the monomer R1, about 10% of the monomer R2 and about 5% of the monomer R3. Monomer R1, which is the main component of the random copolymer, gives properties such as glass transition temperature control, improved surface adhesion, solubility and compatibility with other substances. Monomer R2 was selected to improve the compatibility between the random copolymer and the dispersed dye molecules. Finally, the monomer R3 is a functional monomer that can be crosslinked during the post-apply-bake step increasing the Tg of the random copolymer thin film in order to eliminate the berm formation around the created structures.

Five random copolymers were synthesized with different amounts of the monomers R1, R2 and R3. Table 1 contains the composition of these random copolymers as well as the molecular characteristics. The molecular weights of the random copolymers were about 50 KDa and the polydispersities were up to 2.35.

TABLE 1

| compositions and molecular characteristics of the synthesized random copolymers. | | | | |
|---|---|---|---|---|
| Polymers | R1 (% moles) | R2 (% moles) | R3 (% moles) | Mn | PD |
| Polymer 1 | 100 | 0 | 0 | 45000 | 2.25 |
| Polymer 2 | 90 | 10 | 0 | 44000 | 2.15 |
| Polymer 3 | 85 | 10 | 5 | 49000 | 2.30 |
| Polymer 4 | 88 | 10 | 2 | 51000 | 2.25 |
| Polymer 5 | 89 | 10 | 1 | 48000 | 2.35 |

3.1.2 Substrate Preparation

Figure 12:
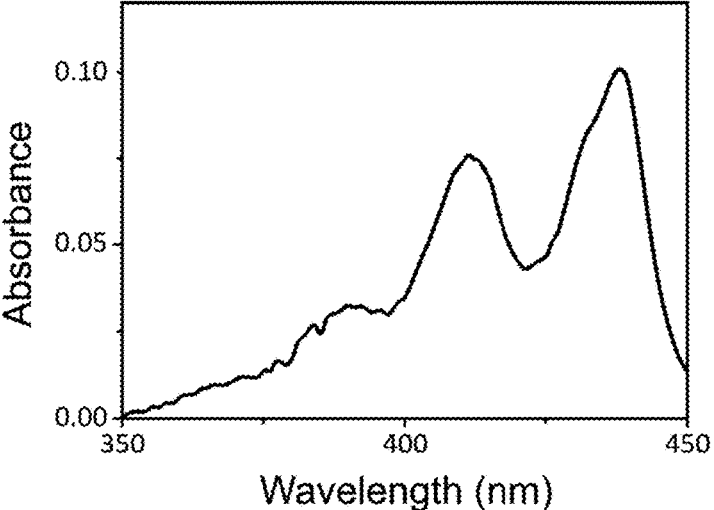
FIG. 12 shows UV-Vis spectrum of a random copolymer thin film doped with 5% perylene. (In Situ Degradation/Ablation Application)

The dye used for doping the random copolymers was perylene. Perylene is a polyaromatic molecule which does not photodegrade during the laser ablation process. The random copolymers were doped with Perylene in 3, 4 and 5% with respect to the random copolymer weight. The polymeric material doped with 5% Perylene had the proper amount of the dye to trigger the ablation process. FIG. 12 contains a UV-Vis spectrum of a polymeric material doped with 5% Perylene. Absorbance of the doped random polymer at 375 nm, which is the wavelength of the laser used for ablation, does not exceed 0.02.

Polymer 1 thin films were made by spin coating, the concentration of Perylene molecules was 5% with respect to polymer's weight. At that concentration it was found that the thin films contained regions with dye aggregations, caused by the chemical incompatibility between the polymeric matrix and the dye molecule. The perylene molecules tend to crystallize, due to their aromatic nature, and if the concentration of the dye exceeds 3% with respect to the polymer's weight, regions with crystallized perylene aggregates appear. By introducing groups that improve the compatibility between the polymer matrix and the perylene molecules into the polymer's backbone, this behaviour can be eliminated. Polymer 2 contains 10% of monomer R2, with respect to the polymer, which is selected to have chemical similarities with perylene molecules, delivering better dye distribution into the polymeric matrix and eliminating the dye aggregation problem. A thin film of polymer 2 doped with 5% perylene, with respect to the polymer's weight, appeared to have no dye aggregation defects and can be used for laser processing.

3.2 Non-Laser Ablation/Negative Tone Photoresist Example

3.2.1 Materials Design and Properties

Figure 13:
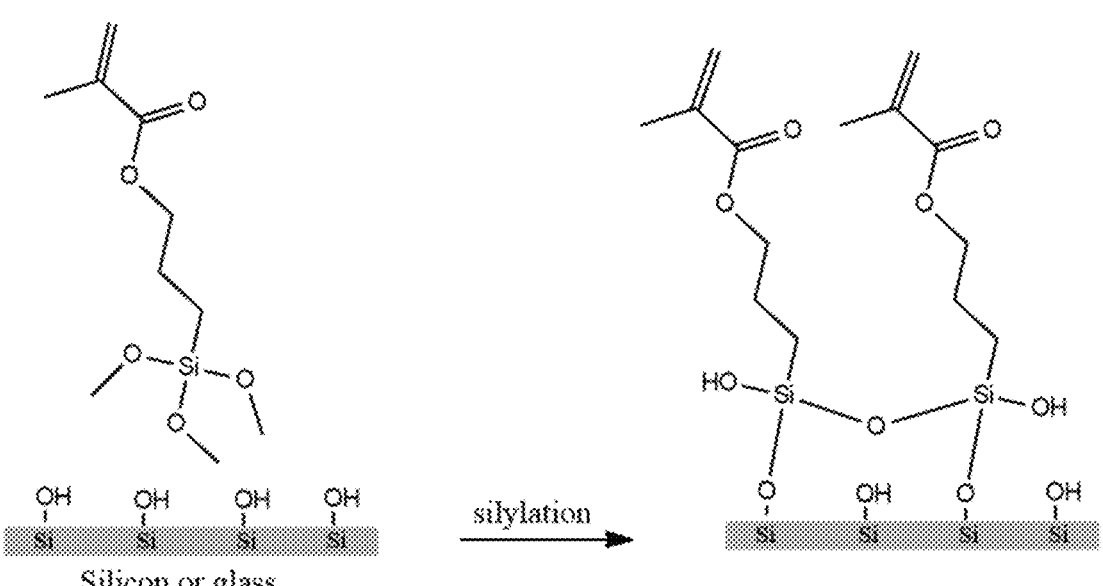
FIG. 13 is an illustration of the substrate priming process
Figure 14:
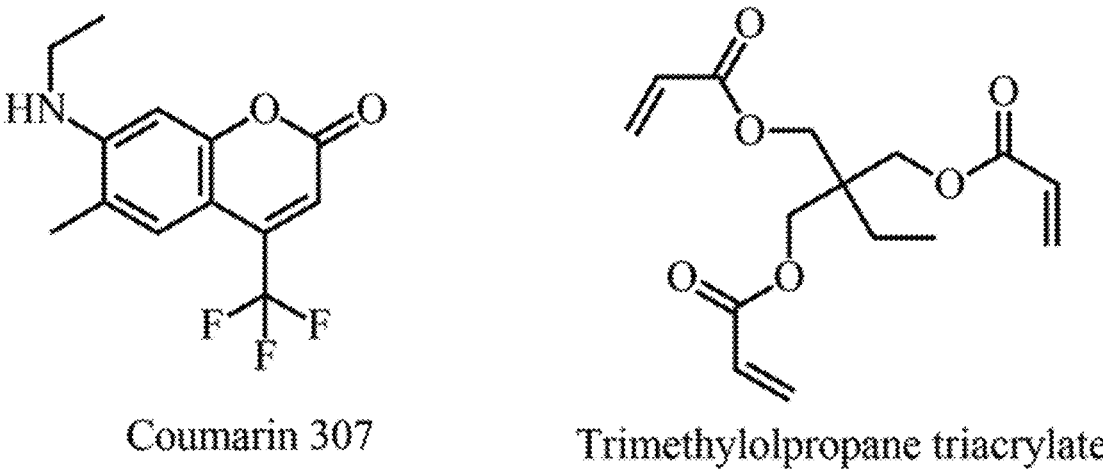
FIG. 14 is an illustration of the chemical structures of coumarin 307 and trimethylolpropne triacrylate. (Negative Photoresist Application)

FIG. 13 shows the chemical structure of the primed with MAPTMS glass substrates. Methacrylic moieties have been introduced on the glass substrates allowing the covalent bonding of the fabricated structure with the glass substrate. Trimethylolpropane triacrylate (FIG. 14) have been chosen as a trifunctional monomer bearing acrylic moieties and coumarin 307 (FIG. 14) have been chosen as a dye which has very good solubility in trimethylolpropane triacrylate, exhibiting no aggregation effects whatsoever. Coumarin 307 absorption at the laser wavelength was also efficient for the photosensitization method discussed herein. The trifunctional nature of the monomer allows the crosslinking of the monomer during the laser exposure process resulting into a robust structure which is covalently attached to the substrate.

3.2.2 Substrate Preparation and Post Processing (Development)

Figure 15:
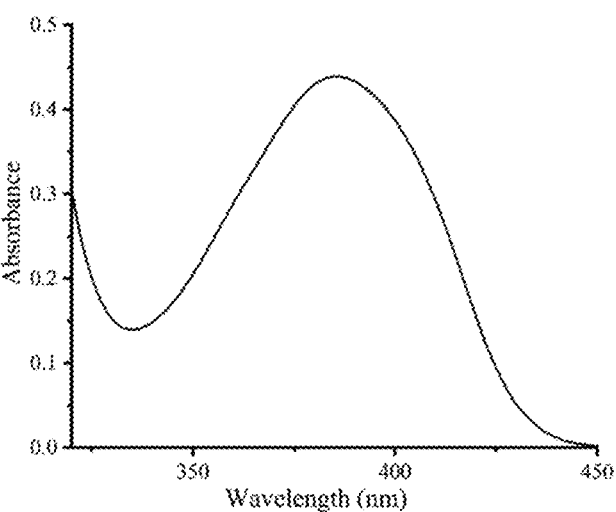
FIG. 15 shows UV-Vis spectrum of trimethylolpropne triacrylate thin film doped with 0.5% w/w coumarin 307. (Negative Photoresist Application)

The dye used for doping the monomer was coumarin 307. The monomer was doped with coumarin 307 in 0.5 w/w. The monomer doped with 0.5% w/w coumarin 307 had the proper amount of the dye to trigger the initiation of the photosensitization process. FIG. 15 contains a UV-Vis spectrum of the monomer doped with 0.5% w/w coumarin 307. A drop from the composite was deposited on the modified glass substrate and was vacuumed for 4 h to remove the oxygen which acts as radical scavenger.

After the laser exposure, the sample was immersed in an isopropanol bath in order to remove the unpolymerized/uncrosslinked areas and then was rinsed with ultrapure water.

3.3 Laser Characteristics (Common to Both Examples)

Figure 8:
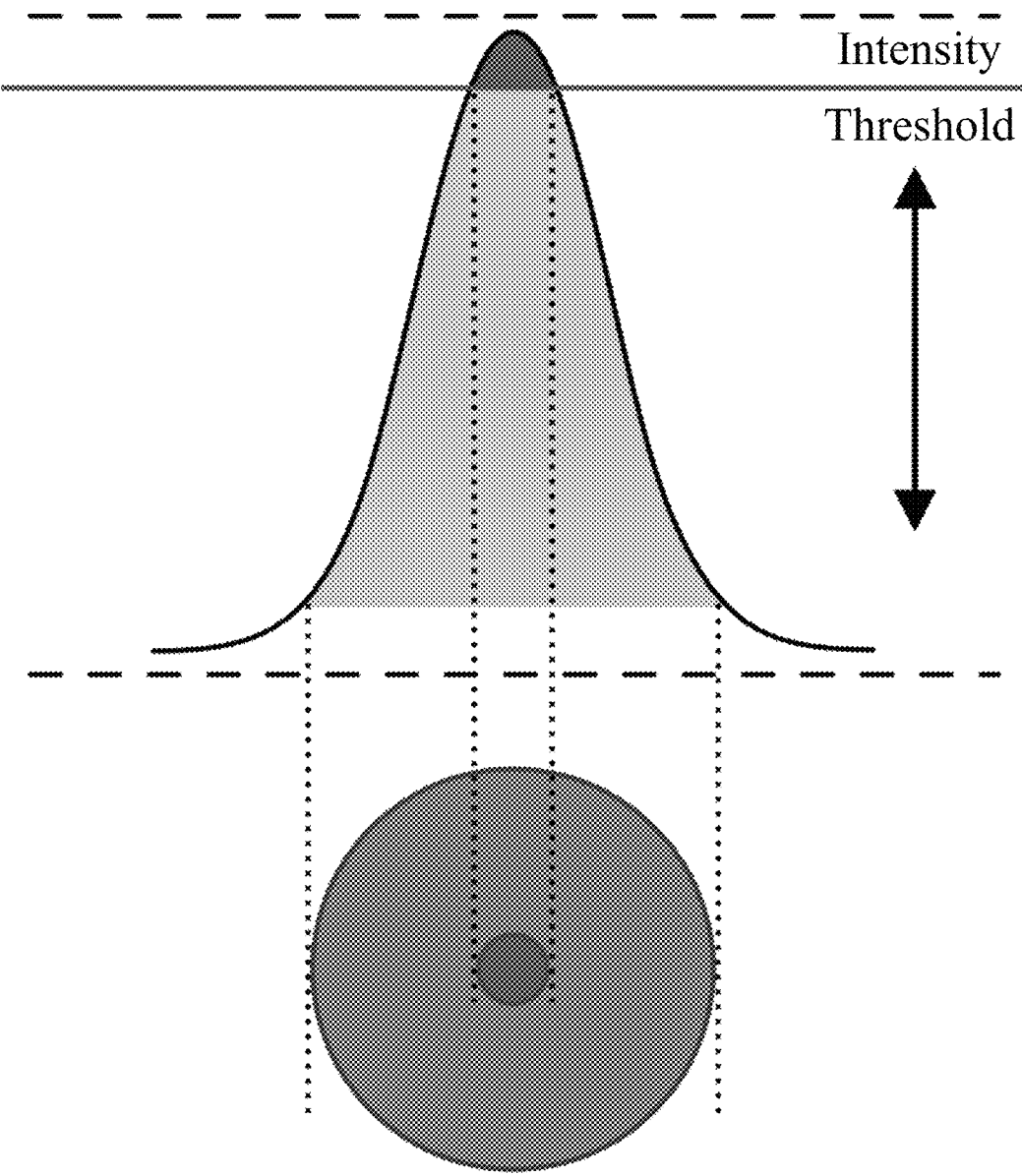
FIG. 8 shows a cross-section of a laser beam and corresponding intensity which follows a Gaussian distribution across the beam diameter wherein the photon-flux at the centre of beam provides a threshold level of photon flux. (All Applications)
Figure 16:
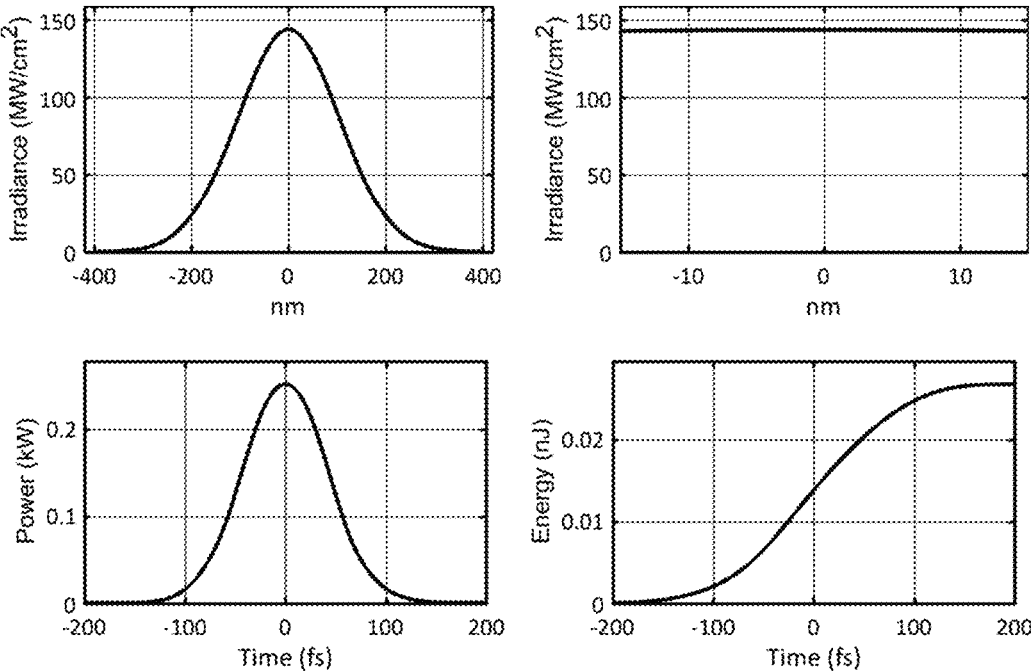
FIG. 16 shows a simulation on irradiance encircling $2 \times 1/e^2$ and 30 nm diameters.

In order to improve our understanding on the Laser characteristics effecting the process, a simple MATLAB simulation was developed to quickly estimate Laser spatial-temporal parameters at the focal point during tests, as shown in FIG. 16. The simulation was capable of accepting laser beam power set-point (mW) and focused spot diameter (nm at $1/e^2$), delivering: irradiance (MW/cm$^2$) across a circle with diameter $2\times1/e^2$ diameter, and along a circle with a diameter equal to a diameter of interest (ROI). $2\times1/e^2$ irradiance was used for comparing direct measurements of the focused beam (after ×1000 magnification) on the beam profiler, irradiance across ROI was helpful to estimate the energy flux threshold that was triggering the photosensitization process on the test films of various chemical compositions. As discussed herein, the Gaussian laser beam profile enable a setup in which only the very centre of the beam is above this threshold, as depicted above FIG. 8.

Focused laser beam profile, as measured by the beam profiler, matched the MATLAB/theoretical calculated profile (for the given laser source wavelength, and the 0.90 NA objective lens used) within the measurement uncertainty range:

| Calculated | FWHM (XY) 247.3 nm | FWE2 (XY) 420.0 nm |
|---|---|---|
| Measured (scaled ×1000) | FWHM (X) 255 nm | FWHM2 (Y) 262 nm |
| Measured (scaled ×1000) | FWE2 (X) 419 nm | FWE2 (Y) 427 nm |

By feeding actual feature dimensions (measured by SEM) of experiment results back to MATLAB, we were able to get detailed graphical representations of irradiance, power (the later by integrating irradiance over ROI) and energy around areas equal to the photosensitized ones during exposure time.

Figures 17, 18:
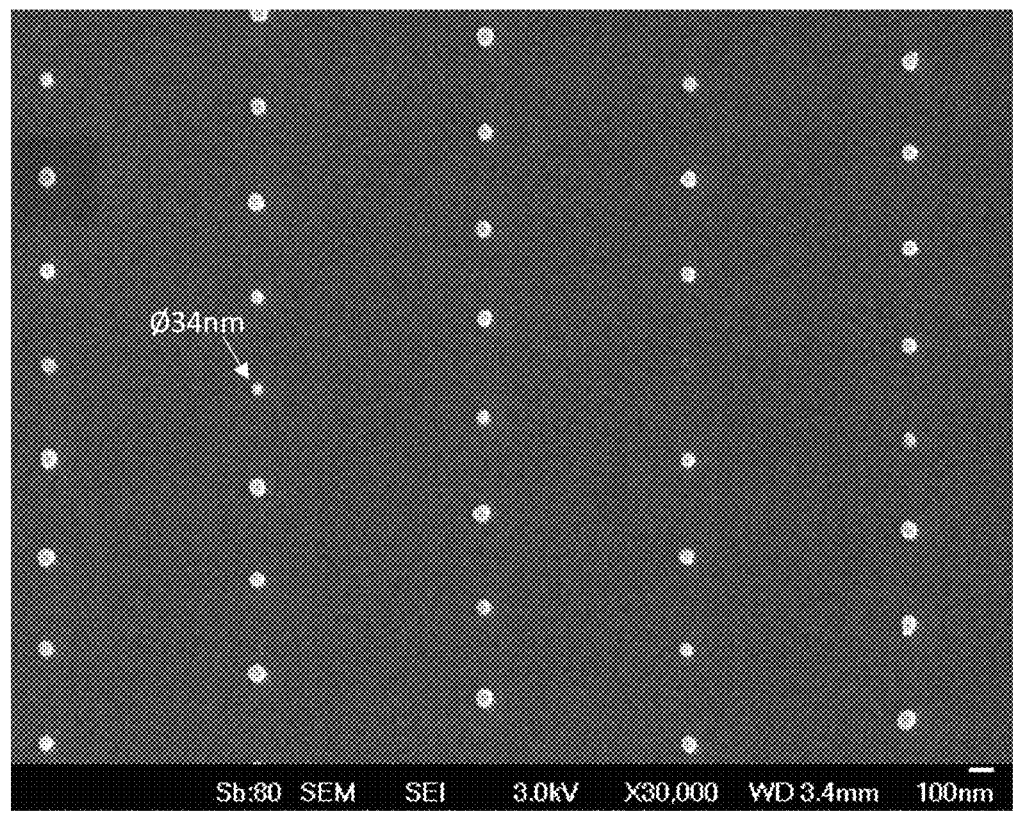
FIG. 17 shows a calculation of irradiance and power differences between continuous wave (used herein) and pulsed (not used herein) laser operation.
FIG. 18 SEM Image of a In Situ Degradation/Ablation Example processed substrate after nickel metallisation (periodic laser on/off times). Pointer on 34 nm feature.

Additionally, to point out the difference, we calculated irradiance, power and energy for a pulsed laser equivalent of the CW laser used, as shown in FIG. 17, delivering the power of our (CW) laser over a single pulse (of the pulsed laser), keeping the rest of the operational parameters the same. Calculations covered various repetition rates and typical temporal pulse profiles (Gaussian, exponential and squared hyperbolic secant), to confirm the unique exposure conditions of the proposed herein use of a modulated CW laser, compared to pulsed lasers.

Formulas used to calculate pulsed laser Power, integrated over time for calculating each pulse energy, and multiplied by the repetition rate to calculate total energy:

$$P_P = P \times FWHM \times f,$$

$$P_G(t) = P_P \cdot \exp\left[-4 \cdot \ln(2) \cdot \left(\frac{t}{FWHM}\right)^2\right]$$

$$P_{EXP}(t) = P_P \cdot 4 \cdot \ln(2) \left(\frac{t}{FWHM}\right)^2 \cdot \exp\left(-\frac{t}{FWHM}\right)$$

$$P_{SECH}(t) = P_P \cdot \mathrm{sech}^2\left[2\ln\left(1+\sqrt{2}\right)\frac{t}{\tau}\right]$$

$$E_G(t) = \frac{P_P \cdot FWHM}{4 \cdot \sqrt{\ln(2)/\pi}}\left[1 + \mathrm{erf}\left(\frac{t}{FWHM}\right)\right] \rightarrow E_G(\infty) = \frac{P_P \cdot FWHM}{2 \cdot \sqrt{\ln(2)/\pi}}$$

$$E_{EXP}(t) = P_P \cdot 4 \cdot \ln(2) \cdot FWHM\left[\frac{\sqrt{\pi}}{4}\mathrm{erf}\left(\frac{t}{FWHM}\right) - \frac{t}{2FWHM}e^{-\left(\frac{t}{FWHM}\right)'}\right] \rightarrow$$

$$E_{EXP}(\infty) = P_P \cdot \sqrt{\pi} \cdot \ln(2) \cdot FWHM$$

$$E_{SECH}(t) = \frac{P_P \cdot FWHM}{2 \cdot \ln\left(1+\sqrt{2}\right)}\left[1 + \tanh\left(\frac{t}{FWHM}\right)\right] \rightarrow E_{SECH}(\infty) = \frac{P_P \cdot FWHM}{\ln\left(1+\sqrt{2}\right)}$$

3.4.1 Laser Ablation/In Situ Degradation Example

Thin film coatings, without defects produced by perylene molecule aggregation, appear in FIG. 18 (SEM Image of Substrate after metallisation). The processed substrate used Polymer 5, containing only 1% of crosslinkable groups. In this polymer structures, berm formation was not observed due to finely crosslinking the polymer.

3.4.2 Non-Laser Ablation/Negative Tone Photoresist Example

Figure 19:
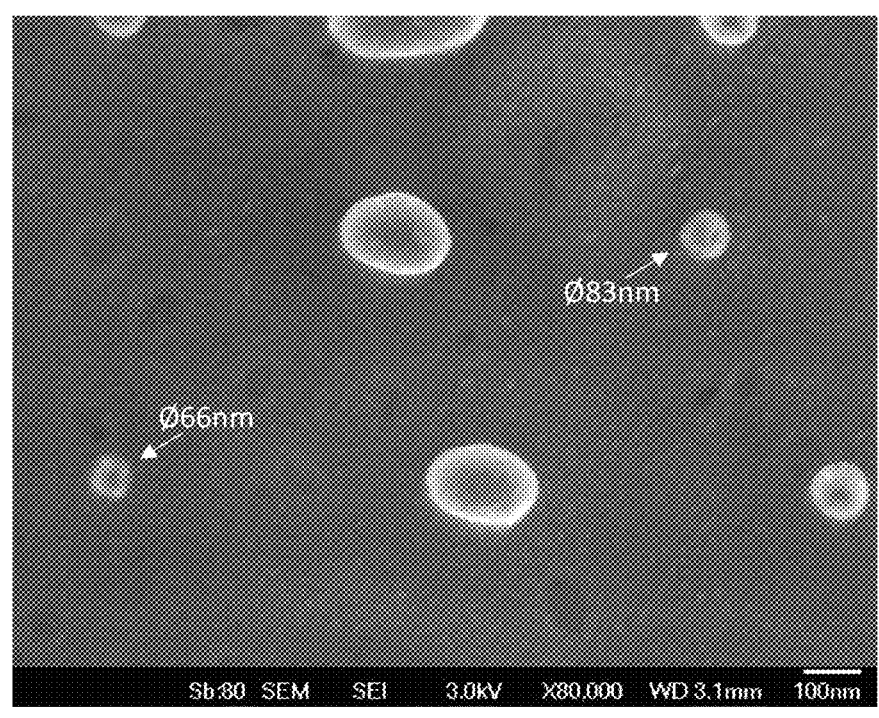
FIG. 19 SEM Image of Negative Photoresist Example processed substrate after development—Exposed, by the laser, areas appearing as pillars (random laser on/off times). Pointer on 66 nm and 83 nm features.
Figure 20:
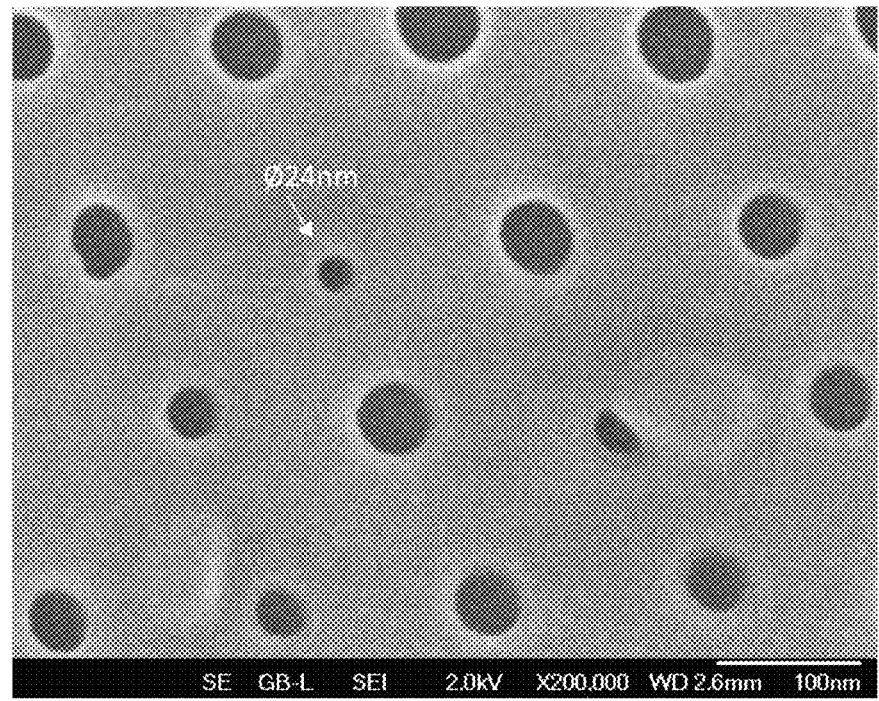
FIG. 20 SEM Image of Positive Photoresist Example processed substrate after development—Exposed, by the laser, areas appearing as holes (random laser on/off times). Pointer on 24 nm feature.

FIG. 19 (SEM Image of Substrate after Development) Structures with dimensions lower than 100 nm were fabricated by using trimethylolpropane triacrylate, as a photo radical generator and polymerizing/crosslinking agent, and coumarin 307 as a dye/photosensitizer. The Development process was carried out using isopropanol as a solvent/developer.

3.4.3 Laser Power and Modulation (Common to Both Examples)

The power of the exposing laser varies from 40 to 80 mW, which attributes to several MW/cm2 light intensity. The length of the created structures is adjusted by the duration and the modulation of the 'laser-on' times, taking values from 10 to several hundred nanoseconds. Structures shown have several dimensions in response to different power setting of the laser firing each 'laser-on' period. The smallest created structure is in the sub 20 nm regime.

The invention claimed is:

1. A method of photoexcitation of a composite negative photoresist, consisting essentially of:

providing a translatable substrate having a composite negative photoresist thereon, the composite negative photoresist comprising at least a first material and a second material, but not including a photo acid generator, photo radical generator, or photo base generator, wherein;

the first material has at least a first energy level, a second energy level, and at least one interceding energy level between the first and second energy levels; and the second material has at least a first energy level and a second energy level, wherein the second material is polymerized when at least one electron is excited into the second energy level of the second material, wherein an energy gap between the first energy level and the at least one interceding energy level of the first material is less than the energy gap between the first and second energy level of the second material, and wherein the first material and second material are sufficiently close to one another to facilitate transfer of at least one electron; and exposing predetermined areas of the composite to a beam of photons emitted from a continuous wave diode laser by focusing the beam of photons on the composite with an objective lens, wherein the beam has a central energy flux, wherein the central energy flux is sufficient to:

excite at least one electron from the first energy level of the first material to the at least one interceding energy level;

excite the at least one electron from the at least one interceding energy level to the second energy level of the first material; and transfer the at least one electron from the second energy level of the first material to the second energy level of the second material to cause polymerization of the second material at the predetermined areas;

wherein said photons have an energy lower than the energy gap between the first and second energy level of the second material;

and wherein the exposing step is performed while continuously translating the translatable substrate, so as to form a photolithographic pattern on the substrate.

2. The method of claim 1, wherein the second material includes a monomer or an oligomer.

3. The method of claim 1, wherein the continuous wave diode laser operates at the wavelength of 375 nm.

4. The method of claim 1, wherein exposing the predetermined areas to the continuous wave diode laser causes the polymerization of the second material within the composite in the predetermined areas with dimensions below the operational wavelength of the continuous wave diode laser.

5. The method of claim 1, wherein the second material is a multifunctional (meth)acrylic compound.

* * * * *